(12) United States Patent
Chung et al.

(10) Patent No.: US 12,363,966 B2
(45) Date of Patent: Jul. 15, 2025

(54) SEMICONDUCTOR DEVICES AND METHOD OF FORMING THE SAME

(71) Applicant: Taiwan Semiconductor Manufacturing Company, Ltd., Hsinchu (TW)

(72) Inventors: Pei Yun Chung, Hsinchu (TW); Chun-Chih Cheng, Changhua County (TW); Ying-Liang Chuang, Hsinchu County (TW); Ming-Hsi Yeh, Hsinchu (TW); Kuo-Bin Huang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 602 days.

(21) Appl. No.: 17/848,406

(22) Filed: Jun. 24, 2022

(65) Prior Publication Data

US 2023/0420508 A1     Dec. 28, 2023

(51) Int. Cl.
| | |
|---|---|
| H10D 62/10 | (2025.01) |
| H10D 30/01 | (2025.01) |
| H10D 30/43 | (2025.01) |
| H10D 30/67 | (2025.01) |
| H10D 64/01 | (2025.01) |
| H10D 84/01 | (2025.01) |
| H10D 84/03 | (2025.01) |

(52) U.S. Cl.
CPC ......... *H10D 62/121* (2025.01); *H10D 30/014* (2025.01); *H10D 30/43* (2025.01); *H10D 30/6735* (2025.01); *H10D 30/6757* (2025.01); *H10D 64/021* (2025.01); *H10D 84/0128* (2025.01); *H10D 84/0147* (2025.01); *H10D 84/0153* (2025.01); *H10D 84/038* (2025.01)

(58) Field of Classification Search
CPC .......... H10D 84/0151; H10D 30/6735; H10D 30/014; H10D 30/43; H10D 62/121; H10D 84/832; H10D 84/833; H10D 84/0153; H10D 84/853; H01L 21/3213; H01L 21/30604; H01L 21/32134; H01L 21/32138
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |

(Continued)

*Primary Examiner* — Alia Sabur
(74) *Attorney, Agent, or Firm* — JCIPRNET

(57) ABSTRACT

A method of forming a semiconductor device includes the following steps. A metal layer with at least one silicon-containing pattern therein is provided. A first wet etching process is performed by using a first etching solution, to clean a surface of the metal layer, wherein the first etching solution contains a base and a first oxidant. At least one cycle is performed. Each cycle includes a second wet etching process and a cleaning process. The second wet etching process is performed by using a second etching solution, to remove the metal layer, wherein the second etching solution contains an acid and a second oxidant. A cleaning process is performed.

20 Claims, 15 Drawing Sheets

(56) References Cited

U.S. PATENT DOCUMENTS

| | | |
|---|---|---|
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2010/0124823 A1* | 5/2010 | Yeh .................... H10D 84/0179 257/E21.536 |
| 2014/0256131 A1* | 9/2014 | Wang ................ H01L 21/32135 438/676 |
| 2019/0131297 A1* | 5/2019 | Chen ................ H01L 21/32133 |
| 2022/0199400 A1* | 6/2022 | Fujita ................ H01L 21/6708 |

* cited by examiner

SEMICONDUCTOR DEVICES AND METHOD OF FORMING THE SAME

BACKGROUND

The semiconductor integrated circuit (IC) industry has experienced exponential growth. Technological advances in IC design and materials have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, scaling down has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
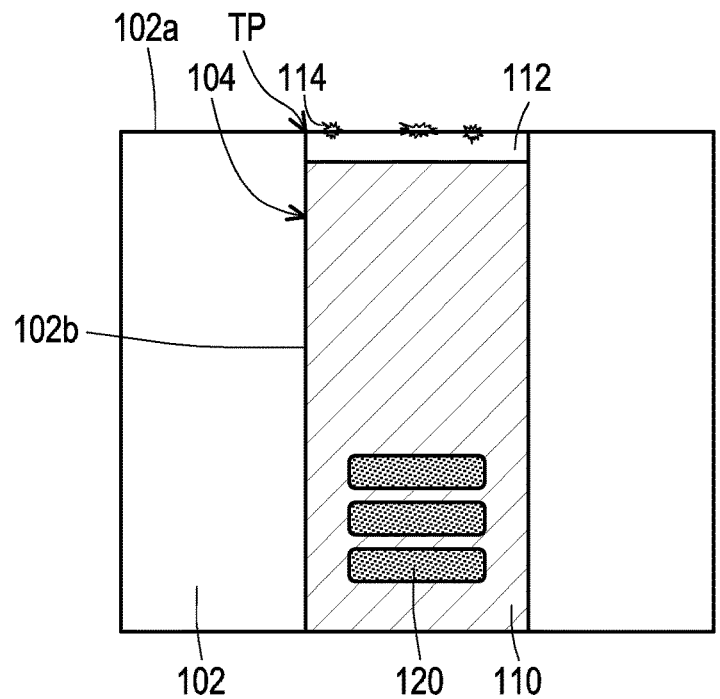
FIG. 1A to FIG. 1F are schematic cross-sectional views of a method of forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure may be used to form gate stacks suitable for use in planar bulk metal-oxide-semiconductor field-effect transistors (MOSFETs), multi-gate transistors (planar or vertical) such as FinFET devices, gate-all-around (GAA) devices, Omega-gate (a-gate) devices, or Pi-gate (II-gate) devices, as well as strained-semiconductor devices, silicon-on-insulator (SOI) devices, partially-depleted SOI devices, fully-depleted SOI devices, or other devices as known in the art. In addition, embodiments disclosed herein may be employed in the formation of p-type and/or n-type devices. One of ordinary skill may recognize other embodiments of semiconductor devices that may benefit from aspects of the present disclosure. For example, some embodiments as described herein may also be applied to the formation of contacts, vias, or interconnects.

FIG. 1A to FIG. 1F are schematic cross-sectional views of a method of forming a semiconductor device in accordance with some embodiments of the present disclosure.

Referring to FIG. 1A, a metal layer 110 with at least one silicon-containing pattern 120 therein is provided. In some embodiments, the metal layer 110 is disposed in an opening 104 of a dielectric layer 102, and a plurality of silicon-containing patterns 120 are disposed in the metal layer 110. For example, the opening 104 has a depth in a range of 100 nm to 250 nm and a width in a range of 5 nm to 20 nm. In some embodiments, the opening 104 has an aspect ratio in a range of 5 to 50. In some embodiments, the metal layer 110 is surrounded by the dielectric layer 102. The dielectric layer 102 includes a top surface 102a and an inner sidewall 102b in direct contact with the metal layer 110, for example. In some embodiments, a turning point TP (or a sharp corner) is formed between the top surface 102a and the inner sidewall of in direct contact with the metal layer 110. However, the disclosure is not limited thereto. In some alternative embodiments, the metal layer 110 is exposed or surrounded by other layers such as spacers.

In some embodiments, the silicon-containing patterns 120 are vertically stacked on each other, and the metal layer 110 wraps around each of the silicon-containing patterns 120. The silicon-containing patterns 120 may be embedded in the metal layer 110. For example, portions of the metal layer 110 are alternately disposed with the silicon-containing patterns 120, and a portion of the metal layer 110 is disposed above the silicon-containing patterns 120. In some embodiments, exposed surfaces of the silicon-containing patterns 120 are entirely surrounded by the metal layer 110. However, the disclosure is not limited thereto. In some alternative embodiments, the metal layer 110 wraps both top and bottom surfaces of the silicon-containing patterns 120, while sidewalls of the silicon-containing patterns 120 are not wrapped by the metal layer 110. In some embodiments, the silicon-containing patterns 120 are sheets such as nanosheets. However, the disclosure is not limited thereto. The silicon-containing patterns 120 may have other suitable shapes and/or arrangements. In some embodiments, the metal layer 110 and the silicon-containing patterns 120 are also collectively referred to as a sacrificial structure since they are going to be removed. It is noted that three (3) layers of silicon-containing patterns 120 are illustrated in FIG. 1A, which is for illustrative purposes only and not intended to be limiting. It can be appreciated that any number of silicon-containing patterns 120 may be disposed in the metal layer 110. In some embodiments, as shown in FIG. 1A, a native oxide layer 112 and/or surface contaminants 114 may exist on a top surface of the metal layer 110. However, the disclosure is not limited thereto.

In some embodiments, a material of the metal layer 110 includes a work function metal such as TiN, TaN, TaAlC, TiC, TaC, Co, Al, TiAl, HfTi, TiSi, TaSi, TiAlC, the like and a combination thereof or other suitable metal, and the metal layer 110 is deposited and/or formed by using atomic layer deposition (ALD), physical vapor deposition (PVD), chemical vapor deposition (CVD), e-beam evaporation, or other suitable process. The metal layer 110 may be a single layer or a multilayer of two or more of above materials. In some embodiments, a material of the silicon-containing patterns 120 includes silicon, silicon oxide, the like, a combination thereof or other suitable silicon-containing material. The silicon-containing patterns 120 may be formed by an epitaxial growth process such as a molecular beam epitaxy (MBE) process, a metalorganic chemical vapor deposition (MOCVD) process, the like and a combination thereof or other suitable processes. The silicon-containing patterns 120 may be each a single layer or a multilayer of two or more of above materials.

Figure 1B:
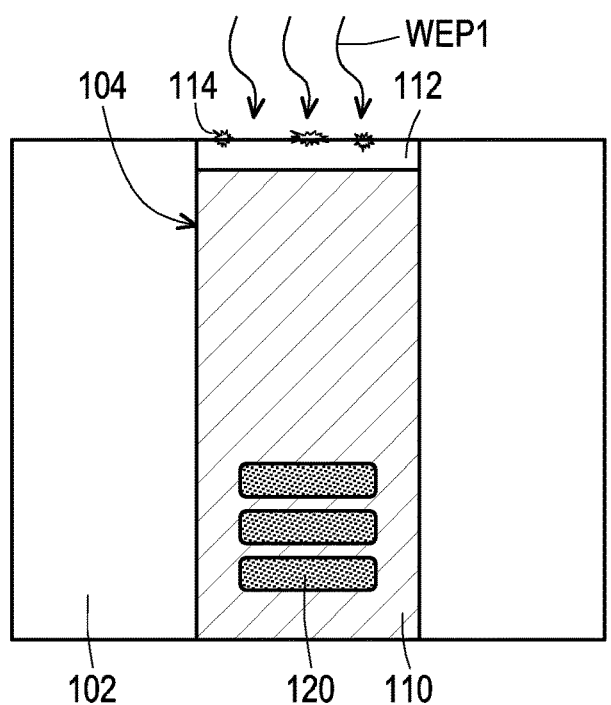

Referring to FIG. 1B, a wet etching process WEP1 is performed, to clean a surface of the metal layer 110. In some embodiments, the wet etching process WEP1 removes the native oxide layer 112 and/or the surface contaminants 114 which may exist on the top surface of the metal layer 110. In some embodiments, this step is also referred to as a break through step. In some embodiments, the wet etching process WEP1 uses an alkaline etching solution containing a base and an oxidant. The base may include ammonia ($NH_4OH$), tetramethylammonium hydroxide (TMAH), tetraethylammonium hydroxide (TEAH), the like, a combination thereof or other suitable base, and a concentration of the base may be in a range of 0.1 wt % to 50 wt %. The oxidant may include peroxide ($H_2O_2$), ozone, the like, a combination thereof or other suitable oxidant, and a concentration of the oxidant may be in a range of 0.1 ppm to $10^7$ ppm. The alkaline etching solution further includes water ($H_2O$). In an embodiment, the alkaline etching solution contains $NH_4OH$, $H_2O_2$ and $H_2O$. For example, the alkaline etching solution is consisting of $NH_4OH$, $H_2O_2$ and $H_2O$.

Figure 1C:
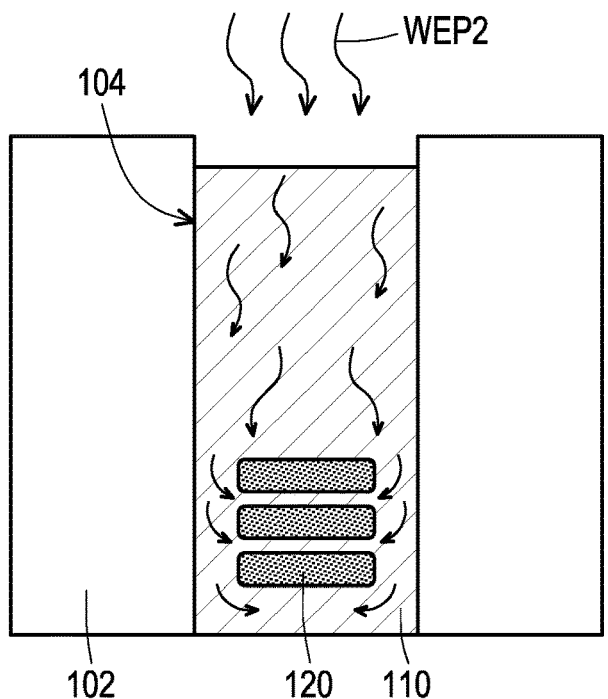
Figure 1D:
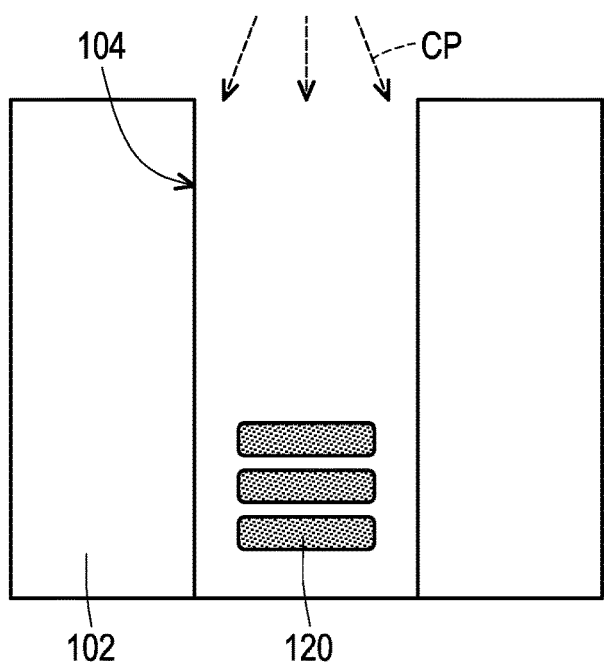

Referring to FIG. 1C and FIG. 1D, at least one cycle is performed to remove the metal layer 110. In some embodiments, each cycle includes a wet etching process WEP2 and a cleaning process CP. In some embodiments, the wet etching process WEP2 is a main etching step, to remove the metal layer 110 by etching and remove remaining residues by overetching. Since the wet etching process WEP2 is an isotropic process, as shown in FIG. 1C, the metal layer 110 may be globally removed without direction. Thus, the etching path would not be obstructed and/or shielded by heteromaterials such as the silicon-containing patterns 120, and the metal layer 110 around the silicon-containing patterns 120 and below the silicon-containing patterns 120 may be removed, as shown in FIG. 1D. In some embodiments, the wet etching process WEP2 uses an acidic etching solution containing an acid and an oxidant. The acid may include hydrogen chloride (HCl), $H_2SO_4$, $H_3PO_4$, the like, a combination thereof or other suitable acid, and a concentration of the acid may be in a range of 0.1 wt % to 50 wt %. The oxidant may include peroxide ($H_2O_2$), ozone, the like, a combination thereof or other suitable oxidant, and a concentration of the oxidant may be in a range of 0.1 ppm to $10^7$ ppm. The oxidant in the acidic etching solution may be the same as or different from the oxidant using in the alkaline etching solution. The acidic etching solution further includes water ($H_2O$). In an embodiment, the acidic etching solution contains HCl, $H_2O_2$ and $H_2O$. For example, the acidic etching solution is consisting of HCl, $H_2O_2$ and $H_2O$. In some embodiments, as shown in FIG. 1D, after performing the wet etching process WEP2, surfaces of the silicon-containing patterns 120 and sidewalls of the dielectric layer 102 are exposed.

In some embodiments, as shown in FIG. 1D, the cleaning process CP is performed. For example, the cleaning process CP physically removes the remained etching solution such as the remained alkaline etching solution and the remained acidic etching solution and ions generated after the wet etching process WEP2. In some embodiments, the cleaning process CP is performed by using a water nanospray such as DI water nanospray. For example, the water nanospray is provided above the silicon-containing patterns 120. The water nanospray may clean surfaces of the silicon-containing patterns 120 exposed after removing the metal layer 110. In addition, the water nanospray may also clean other layers which are exposed due to the removal of the metal layer 110, such as the dielectric layer 102, spacers, semiconductor layers and the layers immediately adjacent to the metal layer 110.

Figure 1E:
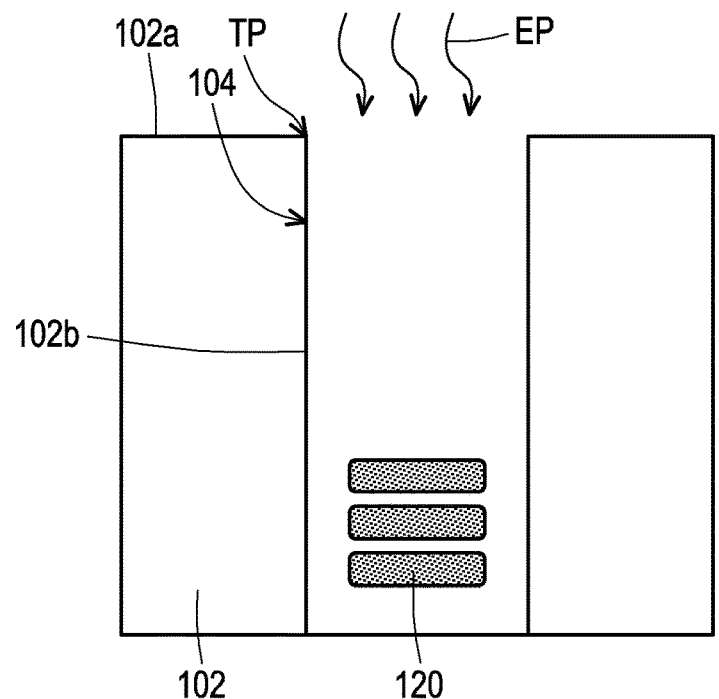

In some embodiments, after performing the wet etching process WEP1, the cycle of the wet etching process WEP2 and the cleaning process CP may be repeated several times according to the requirements. Thus, the metal layer 110 may be removed entirely and there is substantially no metal layer 110 and/or residues remained between the silicon-containing patterns 120 or below the silicon-containing patterns 120. In addition, the wet etching process WEP1 and the wet etching process WEP2 have high selectivity to the silicon-containing patterns 120 and other layers exposed due to the removal of the metal layer 110. Therefore, the silicon-containing patterns 120 and other layers such as the dielectric layer 102 immediately adjacent to the metal layer 110 may be substantially intact without being removed or corroded by the wet etching process WEP1, the wet etching process WEP2 and the cleaning process CP. For example, as shown in FIG. 1E, a profile such as the turning point TP (or a sharp corner) formed between the top surface 102a and the sidewall 102b of the dielectric layer 102 remains without being rounded. In an embodiment where the metal layer 110 is surrounded by the spacer, a shoulder of the spacer remains sharp without being rounded.

Figure 1F:
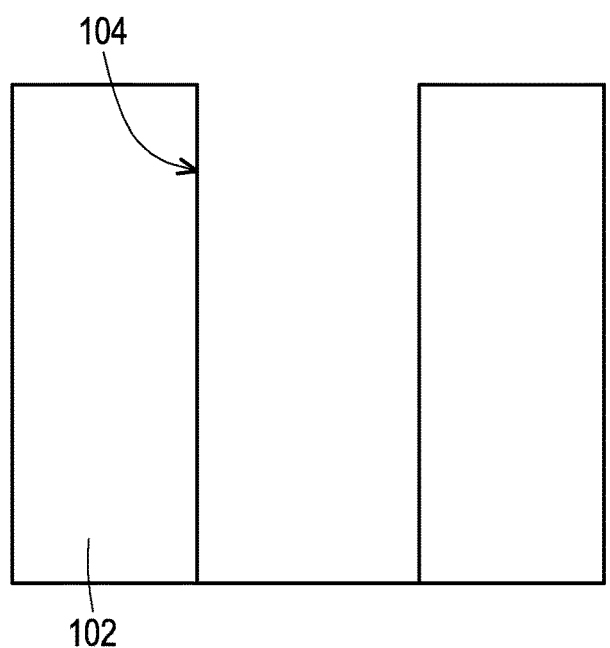

Referring to FIG. 1E and FIG. 1F, an etching process EP is performed to remove the silicon-containing patterns 120. In some embodiments, the etching process EP is performed after all cycles are finished. The etching process EP may have high selectivity between the silicon-containing patterns 120 and the dielectric layer 102. Thus, after performing the etching process EP, as shown in FIG. 1F, the silicon-containing patterns 120 may be removed entirely while the dielectric layer 102 remains substantially intact. The etching process EP may be a dry etching process. The etching process EP may use HBr or any other suitable etchant.

After performing the wet etching process WEP1, the wet etching process WEP2 and the cleaning process CP, and the etching process EP, as shown in FIG. 1F, the materials in the opening 104 are removed entirely, for example. Then, according to the requirements, a dielectric layer (not shown) or any other suitable material may be formed in the opening 104.

In some embodiments, by using the wet etching process WEP1 and the cycle of the wet etching process WEP2 and the cleaning process CP, the metal layer may be removed completely. In detail, the wet etching process WEP2 may globally remove the metal layer without direction. Thus, the etching path would not be obstructed and/or shielded by heteromaterials such as the silicon-containing patterns 120, and the metal layer 110 around the silicon-containing patterns 120 and below the silicon-containing patterns 120 may be removed completely. Furthermore, the cleaning process CP may remove the remained etching solutions and residues, so as to improve the efficiency of the wet etching process WEP2 of the next cycle. In addition, the wet etching process WEP2 has high selectivity between the metal layer 110 and the silicon-containing patterns 120 and other layers (such as the dielectric layer 102 and spacer) immediately adjacent to the metal layer 110, and thus the silicon-containing patterns 120 and other layers may remain intact. For example, the bending, collapse and/or corrosion of the silicon-containing patterns 120 and other layers are prevented. Accordingly, after removal of the metal layer 110 (or removal of the metal layer 110 and the silicon-containing patterns 120), the resulting structure may be intact and have robust construction.

Figure 2A:
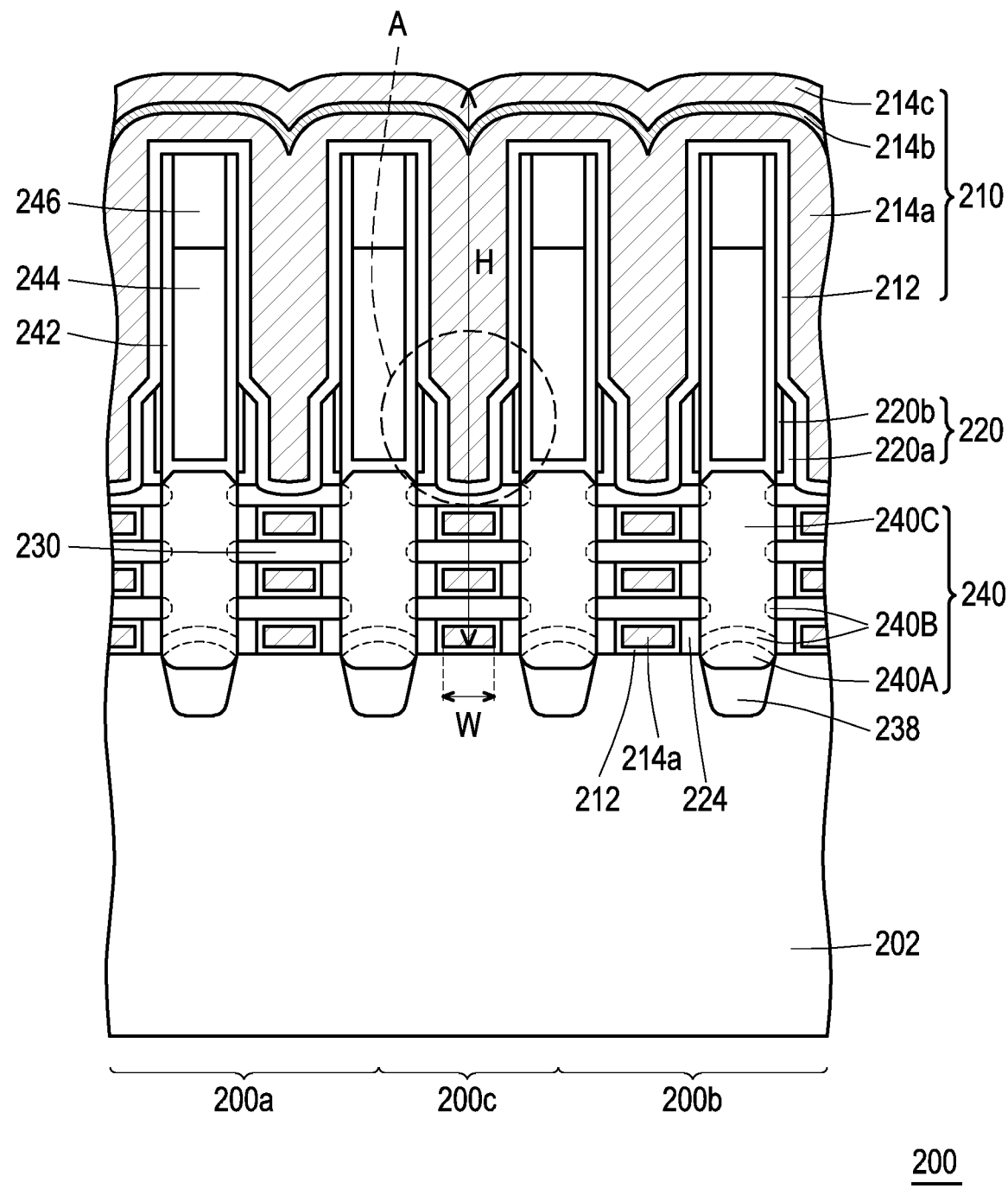
FIG. 2A to FIG. 2G are schematic cross-sectional views of a method of forming a semiconductor device in accordance with some embodiments of the present disclosure.

FIG. 2A to FIG. 2G are schematic cross-sectional views of a method of forming a semiconductor device in accordance with some embodiments of the present disclosure. FIG. 3A, FIG. 3B and FIG. 3C are respectively enlarged views of portion A of FIG. 2A, FIG. 2F and FIG. 2G in accordance with some embodiments of the present disclosure. Referring to FIG. 2A, a semiconductor device 200 is provided. The semiconductor device 200 may be also referred to as a semiconductor structure. In some embodiments, the semiconductor device 200 is a GAA device having gate material disposed on four sides of at least one channel member of the device. The channel member may be referred to as "nanosheet" or "semiconductor nanosheet," which is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including a cylindrical in shape or substantially rectangular cross-section.

In some embodiments, the semiconductor device 200 has a first region 200a, a second region 200b and a separation region 200c between the first region 200a and the second region 200b. In some embodiments, the semiconductor device 200 includes a substrate 202, a plurality of gate structures 210, a plurality of semiconductor nanosheets 230 under the gate structures 210 and a plurality of epitaxial features 240 at opposite sides of the gate structures 210. Since the gate structures 210 and the semiconductor nanosheets 230 in the separation region 200c are going to be removed to electrically isolate the first region 200a and the second region 200b, the gate structures 210 and the semiconductor nanosheets 230 in the separation region 200c are also referred to as sacrificial gate structure and sacrificial semiconductor nanosheets.

The substrate 202 may be a bulk semiconductor substrate such as a bulk silicon wafer. The term "substrate" may be used to refer to just the semiconductor substrate or a semiconductor substrate inclusive of isolation regions. The substrate 202 may be or include any silicon-containing substrate including, but not limited to, single crystal Si, polycrystalline Si, amorphous Si, or Si-on-insulator (SOI) substrates and the like, and may be n-type or p-type doped as desired for a particular application. The substrate 202 may also include other semiconductors such as germanium, silicon carbide (SiC), silicon germanium (SiGe), or diamond. Alternatively, the substrate 202 may include a compound semiconductor an alloy semiconductor.

In some embodiments, the semiconductor nanosheets 230 are disposed under the gate structures 210. In some embodiments, the semiconductor nanosheets 230 are vertically stacked and formed in the channel regions of GAA device. The semiconductor nanosheets 230 may include the same material as the substrate 202. In some embodiments, the semiconductor nanosheets 230 include silicon as the substrate 202. In some embodiments, the semiconductor nanosheets 230 include silicon for an n-type FET and SiGe for a p-type FET. It is noted that three (3) semiconductor nanosheets 230 are illustrated in FIG. 2A, which is for illustrative purposes only and not intended to be limiting. It can be appreciated that any number of semiconductor nanosheets 230 may be formed depending on the desired number of channels regions for the semiconductor device 200.

In some embodiments, the epitaxial features 240 are disposed at opposite sides of the gate structures 210 wrapping the semiconductor nanosheets 230. In some embodiments, the epitaxial features 240 are disposed on and electrically connected to doped regions 238 in the substrate 202. In some embodiments, the doped regions 238 are also referred to as doped source/drain regions, and the epitaxial features 240 are also referred to as epitaxial source/drain features. Source/drain region(s) may refer to a source or a drain, individually or collectively dependent upon the context. However, the disclosure is not limited thereto. In some alternative embodiments, the doped regions 238 are omitted. The epitaxial features 240 may include the same material as the substrate 202. In some embodiments, the epitaxial features 240 include silicon for an n-type FET and SiGe for a p-type FET. The epitaxial features 240 may be formed by an epitaxial growth method using CVD, ALD or molecular beam epitaxy (MBE). The epitaxial features 240 are formed to be in contact with the semiconductor nanosheets 230. The epitaxial features 240 may be merged or separated from each other. The epitaxial features 240 may include a plurality of sub-layers, which are denoted as 240A, 240B, and 240C in accordance with some embodiments. The sub-layers have different concentrations/atomic percentage of silicon, germanium, carbon, and dopant.

In some embodiments, a contact etch stop layer (CESL) 242 is disposed over the epitaxial features 240, and an interlayer dielectric (ILD) layer 244 and a contact 246 are sequentially disposed over the CESL layer 242. The CESL layer 242 may include silicon nitride, silicon oxynitride, silicon nitride with oxygen (O) or carbon (C) elements, and/or other materials; and may be formed by CVD, PVD (physical vapor deposition), ALD, or other suitable methods. The ILD layer 244 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 244 may be formed by PECVD or FCVD (flowable CVD), or other suitable methods. The contact 246 may include cobalt, tungsten, aluminum and/or other suitable conductive materials. In some embodiments, the CESL layer 242 surrounds the ILD layer 244 and the contact 246.

For example, the CESL layer 242 are in direct contact with opposite sidewalls of the ILD layer 244 and the contact 246. In some embodiments, a top surface of the CESL layer 242 is substantially coplanar with a top surface of the contact 246. However, the disclosure is not limited thereto. The top surface of the CESL layer 242 may be lower than the top surface of the contact 246.

In some embodiments, spacers 220 are disposed on opposite sidewalls of the gate structure 210. The spacers 220 may include spacer material such as silicon oxide, silicon nitride, silicon carbide, silicon oxynitride, SiCN films, silicon oxycarbide, SiOCN films, and/or combinations thereof. In some embodiments, the spacers 220 include multiple layers, such as spacer layers 220a and spacer layers 220b. The spacer layers 220a are disposed between the gate structure 210 and the spacer layers 220b, for example. The spacer layers 220a may have L-shape, and the spacer layers 220b may be disposed on the spacer layers 220a. In some embodiments, top surfaces 222c of the spacers 220 are lower than the top surface of the CESL layer 242. In some embodiments, as shown in FIG. 3A, the top surface 222c is disposed between an inner sidewall 222a of the spacer 220 and an outer sidewall 222b, and an included angle θ is formed between the top surface 222c and the inner sidewall 222a of the spacer 220. The included angle θ is in a range of 20 degrees to 30 degrees, for example. A height difference ΔH between the outer sidewall 222b and the inner sidewall 222a of the spacer 220 is in a range of 4 nm to 10 nm, for example. In some embodiments, a turning point TP (or a sharp corner) is formed between the top surface 222c and the inner sidewall 222a of the spacer 220. In such embodiments, the top surface 222c and the inner sidewall 222a of the spacer 220 form a distinct shoulder.

In some embodiments, spacers 224 are configured to separate the gate structures 210 from the epitaxial features 240. In some embodiments, outer sidewalls of the spacers 224 are substantially flush with sidewalls of the semiconductor nanosheets 230. In some embodiments, the inner sidewalls of the spacers 224 are substantially flush with the inner sidewalls 222a of the spacers 220. However, the disclosure is not limited thereto. The spacers 224 may be in direct contact with a gate dielectric layer 212 of the gate structure 210, and the gate dielectric layer 212 is disposed between a work function metal layer 214a of the gate structure 210 and the spacers 224. The spacers 224 may include spacer material such as silicon oxide, silicon nitride, silicon carbide, silicon oxynitride, SiCN films, silicon oxycarbide, SiOCN films, and/or combinations thereof.

In some embodiments, the gate structures 210 each wrap around the semiconductor nanosheets 230. In some embodiments, the gate structures 210 each include at least one work function metal layer 214a, 214b, 214c. In some embodiments, the gate structures 210 each include a gate dielectric layer 212 and the work function metal layers 214a, 214b, 214c. In some embodiments, the gate dielectric layer 212 and the bottommost work function metal layer 214a are formed to wrap around each semiconductor nanosheet 230, and the work function metal layer 214b and the work function metal layer 214c are disposed on the work function metal layer 214a. For example, the gate dielectric layer 212 covers and is in direct contact with exposed surfaces of the semiconductor nanosheet 230 and the spacers 224, and the work function metal layer 214a fills up the space between the semiconductor nanosheets 230. However, the disclosure is not limited thereto. In some alternative embodiments, the gate structures 210 each may include more or less dielectric layer(s) and/or work function metal layer(s).

In some embodiments, the gate dielectric layer 212 includes one or more layers of a dielectric material, such as silicon oxide, silicon nitride, or high-k dielectric material having a dielectric constant greater than, for example, about 3.9 (the dielectric constant of silicon dioxide) or greater than about 7.0, other suitable dielectric material, and/or combinations thereof. Examples of high-k dielectric material include $TiO_2$, $HfZrO$, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. In some embodiments, the gate dielectric layer 212 includes an interfacial layer (not shown) formed between the semiconductor nanosheets 230 and the dielectric material. The gate dielectric layer 212 may be formed by CVD, ALD, PECVD, molecular-beam deposition (MBD), or any suitable method. In one embodiment, the gate dielectric layer 212 is formed using a highly conformal deposition process such as ALD in order to ensure the formation of a gate dielectric layer having a uniform thickness around each semiconductor nanosheets 230. The thickness of the gate dielectric layer 212 is in a range from about 1 nm to about 6 nm, for example.

In some embodiments, a material of the work function metal layer 214a, 214b, 214c includes TiN, TaN, TaAlC, TiC, TaC, Co, Al, TiAl, HfTi, TiSi, TaSi, TiAlC, the like, a combination thereof or other suitable work function metal, and the work function metal layer 214a, 214b, 214c is deposited and/or formed by using atomic layer deposition (ALD), physical vapor deposition (PVD), chemical vapor deposition (CVD), e-beam evaporation, the like or other suitable process. The materials of the work function metal layers 214a, 214b, 214c may be the same or different. In some embodiments, the work function metal layers 214a, 214b and 214c in the first region 200a, the second region 200b and the separation region 200c are physically connected, respectively. Thus, the gate structures 210 in the first region 200a, the second region 200b and the separation region 200c are electrically connected. For example, as shown in FIG. 2A, the gate dielectric layer 212 and the work function metal layers 214a, 214b, 214c continuously extend in the first region 200a, the separation region 200c and the second region 200b, respectively. In some embodiments, the gate dielectric layer 212 continuously wraps around the semiconductor nanosheets 230 and continuously covers the spacers 220, the CESLs 242 and the contacts 246. Similarly, the work function metal layer 214a continuously wraps around the semiconductor nanosheets 230 and is continuously disposed on the gate dielectric layer 212 over the spacers 220, the CESLs 242 and the contacts 246. The work function metal layer 214b is continuously disposed on the work function metal layer 214a in the first, second and separation regions 200a, 200b and 200c, and the work function metal layer 214c is continuously disposed on the work function metal layer 214b in the first, second and separation regions 200a, 200b and 200c, for example. In some embodiments, a height H of the gate structures 210 (e.g., a vertical distance between a top surface of the functional metal layer 214c and a bottom surface of the functional metal layer 214a of the gate structure 210) is in a range of 100 nm to 250 nm and a width W (e.g., a horizontal distance between opposite sidewalls of the functional metal layer 214a) of the gate structures 210 between the semiconductor nanosheets 230 is in a range of 5 nm to 20 nm. In some embodiments, an aspect ratio of the gate structures 210 is in a range of 5 to 50.

Figure 2B:
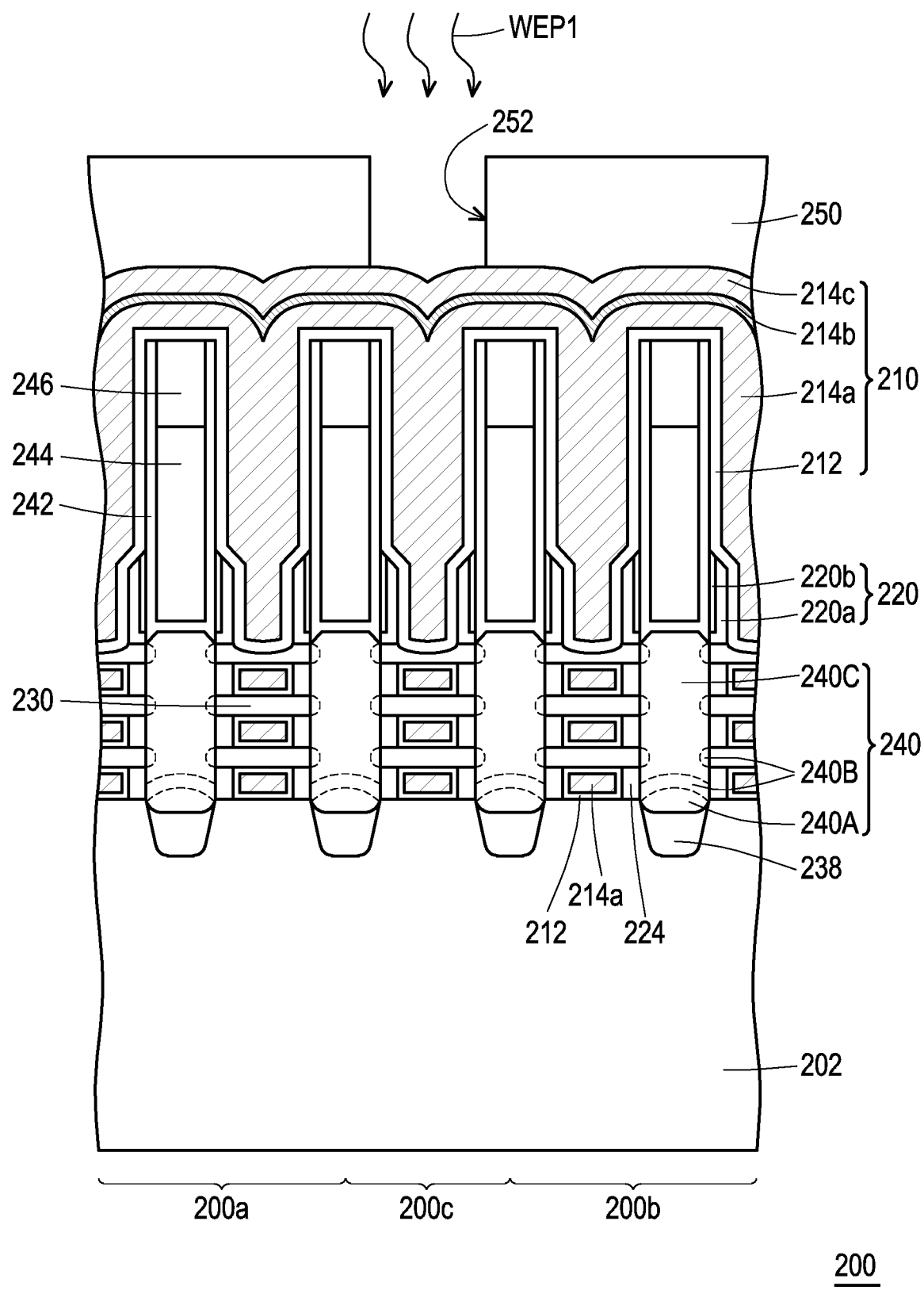
Figure 3A:
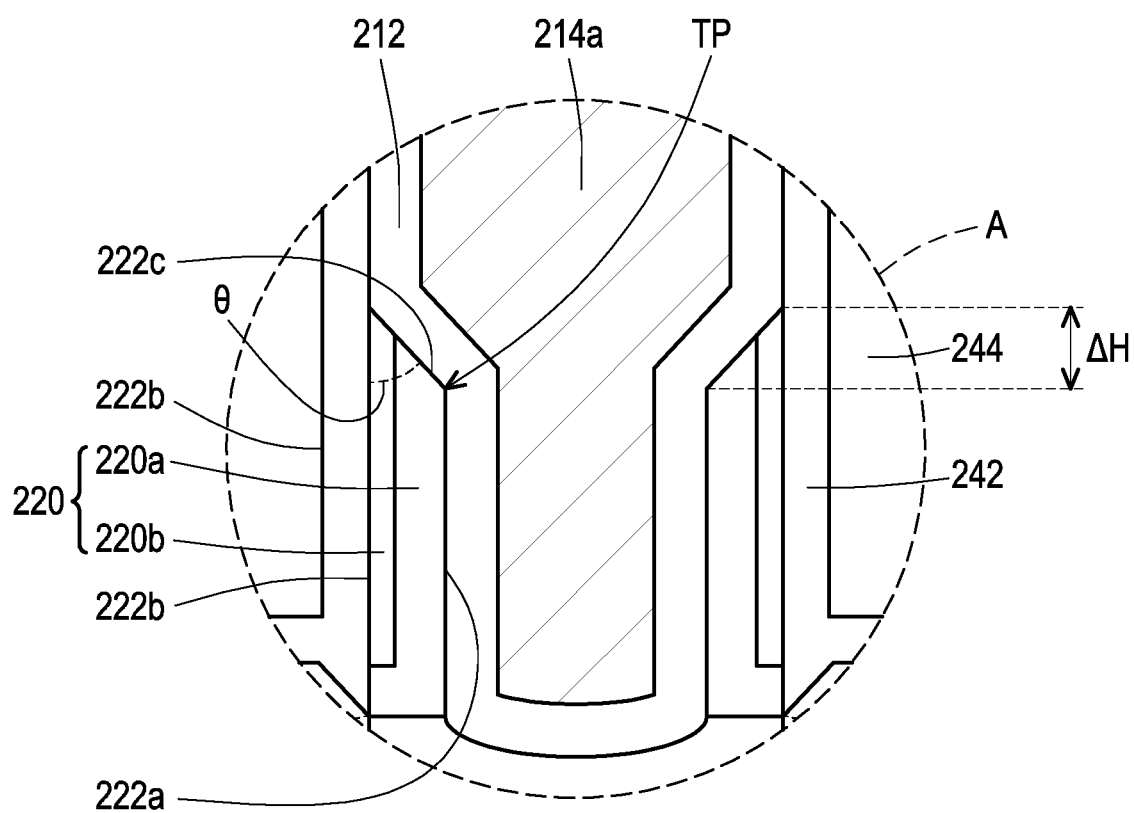
FIG. 3A, FIG. 3B and FIG. 3C are respectively enlarged views of portion A of FIG. 2A, FIG. 2F and FIG. 2G in accordance with some embodiments of the present disclosure.
Figure 3B:
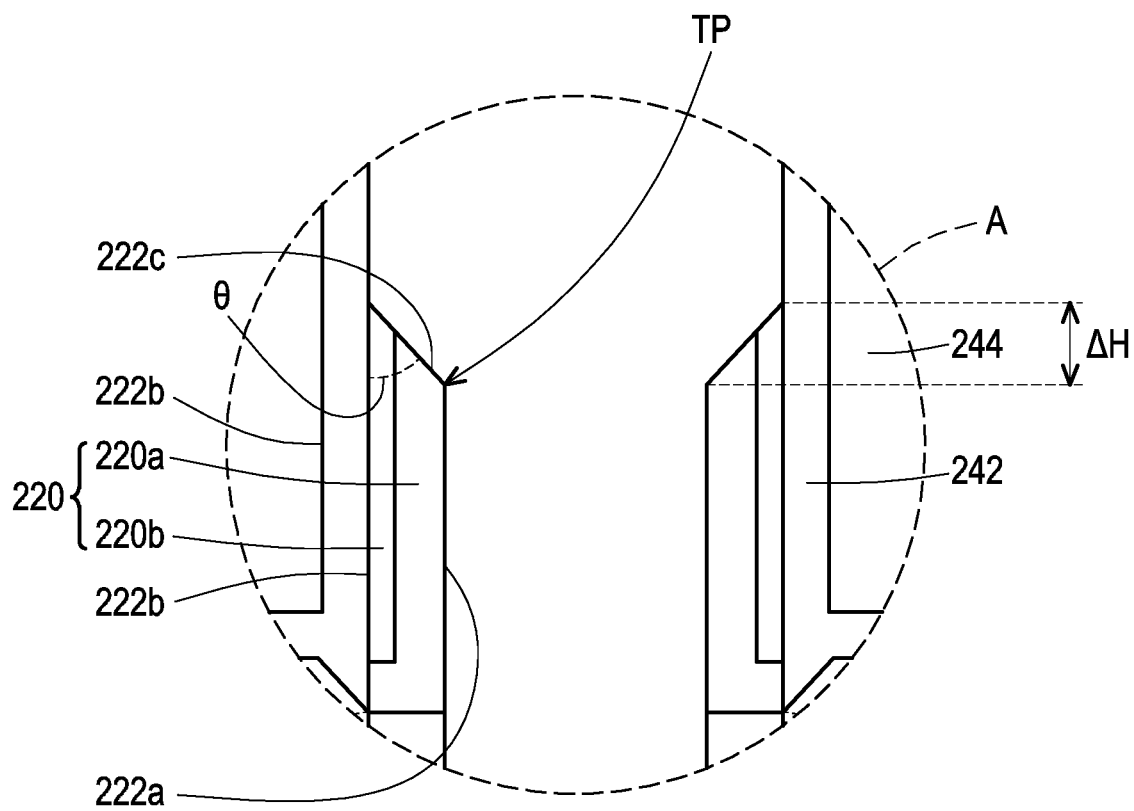
Figure 3C:
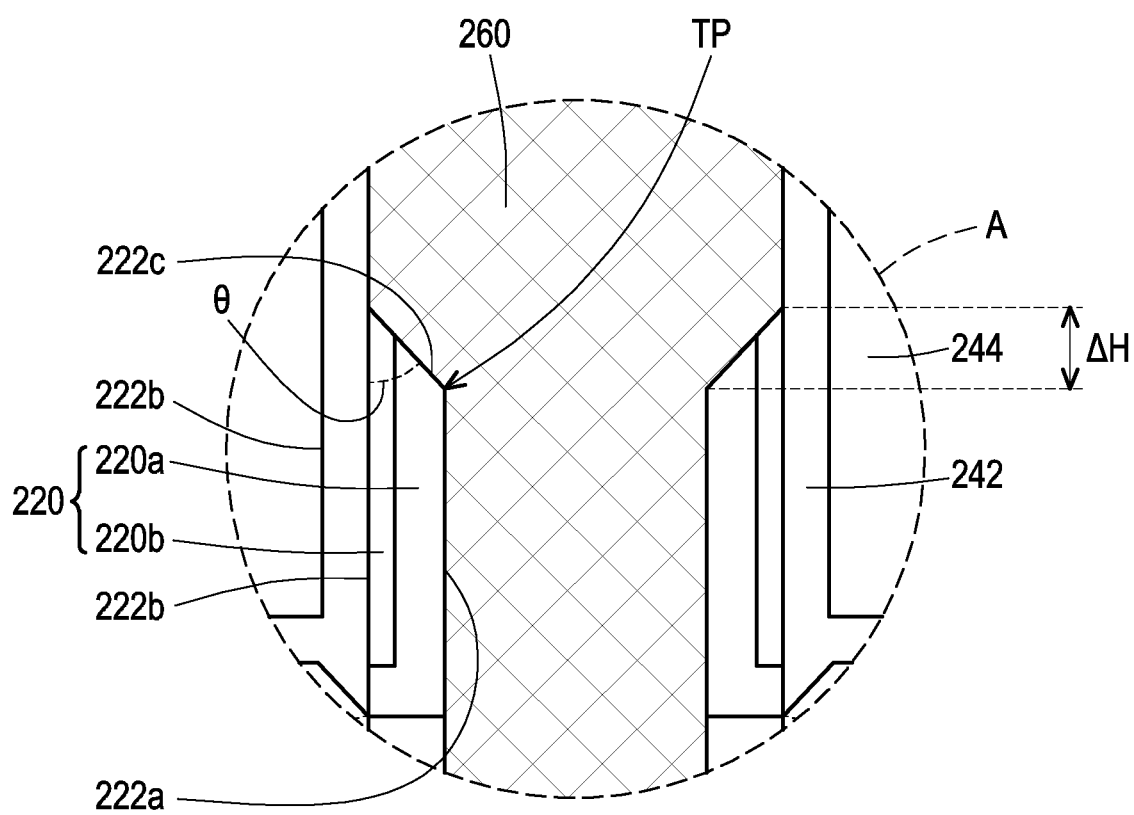

Referring to FIG. 2B, a patterned mask layer 250 is formed over the semiconductor device 200. In some embodiments, the patterned mask layer 250 covers the first region 200a and the second region 200b, and the patterned mask layer 250 has an opening 252 to expose the separation region 200c. For example, the opening 252 exposes a top of the gate structure 210 (i.e., the sacrificial gate structure 210) in the separation region 200c. In some embodiments, the work function metal layer 214c of the gate structure 210 is exposed by the opening 252. In some embodiments, the patterned mask layer 250 is a silicon nitride layer. However, the disclosure is not limited thereto. In some alternative embodiments, the patterned mask layer 250 may be a silicon oxide layer. In some embodiments, the patterned mask layer 250 is formed by low-pressure chemical vapor deposition (LPCVD) or PECVD. In some alternative embodiments, the patterned mask layer 250 may be formed by thermal oxidation or nitridation of silicon. In some embodiments, the patterned mask layer 250 is used as a hard mask during the photolithography and etching process.

Then, by using the patterned mask layer 250 as a mask, a wet etching process WEP1 is performed, to clean a top surface of the gate structure 210 (i.e., the sacrificial gate structure 210) in the separation region 200c. In some embodiments, the wet etching process WEP1 cleans a top surface of the work function metal layer 214c. For example, a native oxide layer (not shown) and/or surface contaminants (not shown) are removed. In some embodiments, this step is also referred to as a break through step. In some embodiments, the wet etching process WEP1 uses an alkaline etching solution containing a base and an oxidant. The base may include ammonia ($NH_4OH$), tetramethylammonium hydroxide (TMAH), tetraethylammonium hydroxide (TEAH), the like, a combination thereof or other suitable base, and a concentration of the base may be in a range of 0.1 wt % to 50 wt %. The oxidant may include peroxide ($H_2O_2$), ozone, the like, a combination thereof or other suitable oxidant, and a concentration of the oxidant may be in a range of 0.1 ppm to $10^7$ ppm. The alkaline etching solution further includes water ($H_2O$). In an embodiment, the alkaline etching solution contains $NH_4OH$, $H_2O_2$ and $H_2O$. For example, the alkaline etching solution is consisting of $NH_4OH$, $H_2O_2$ and $H_2O$.

Figure 2C:
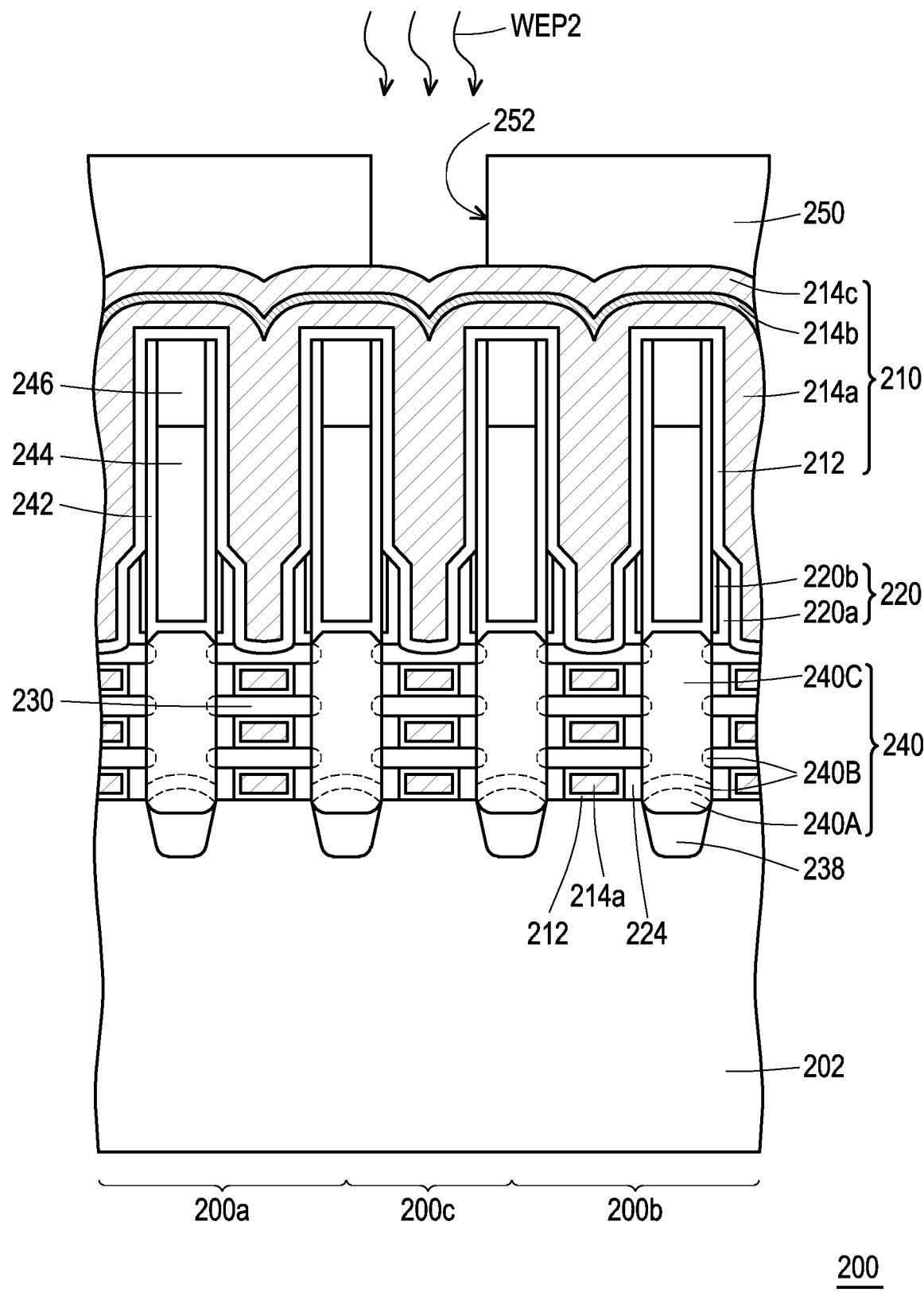
Figure 2D:
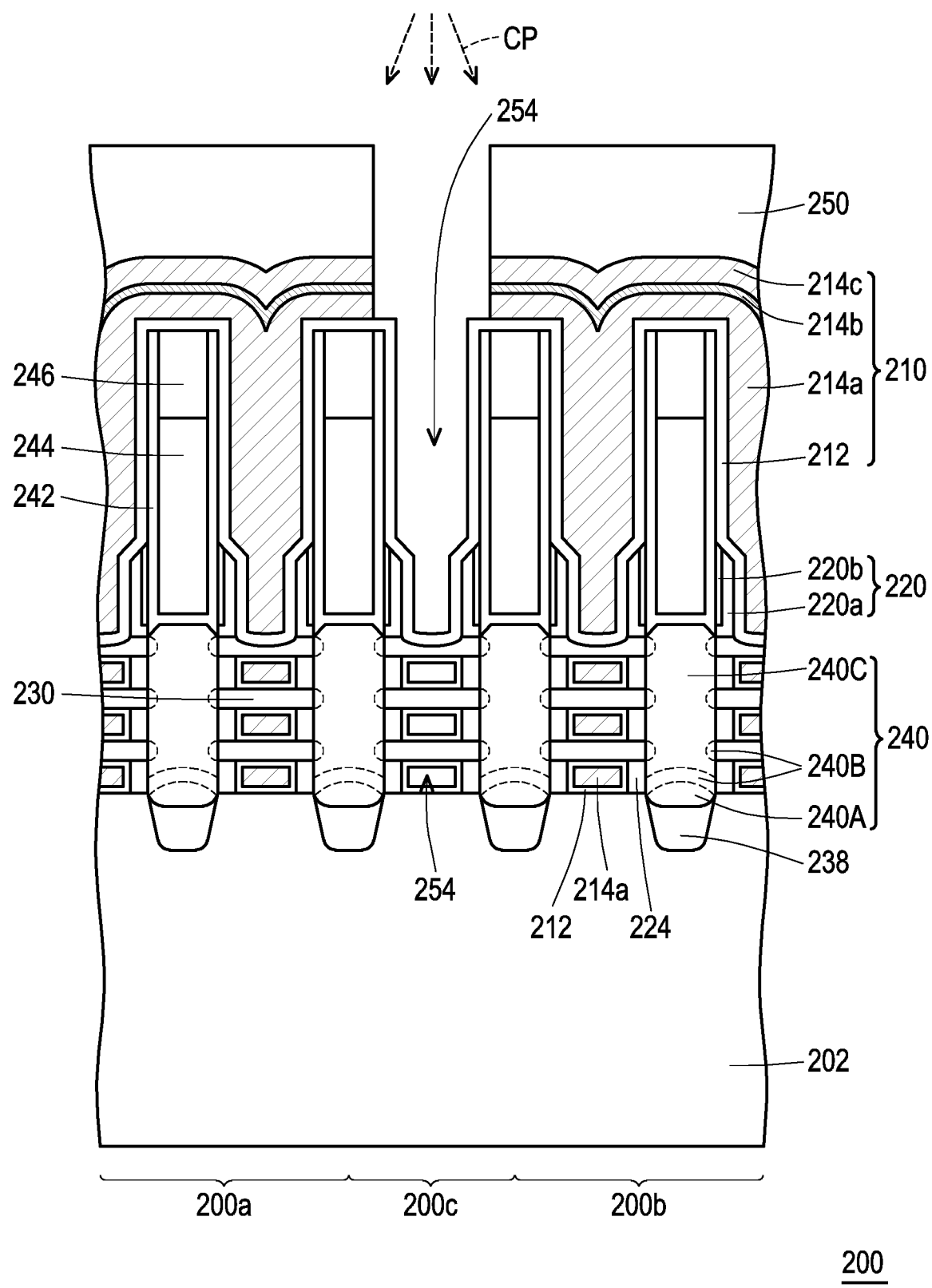

Referring to FIG. 2C and FIG. 2D, at least one cycle is performed to remove the work function metal layers 214a, 214b, 214c. In some embodiments, each cycle includes a wet etching process WEP2 and a cleaning process CP. In some embodiments, the wet etching process WEP2 is a main etching step, to remove the work function metal layers 214a, 214b, 214c and any other metal material by etching and remove remaining residues by overetching. Since the wet etching process WEP2 is an isotropic process, the work function metal layers 214a, 214b, 214c may be globally removed without direction. Thus, the etching path would not be obstructed and/or shielded by heteromaterials such as the semiconductor nanosheets 230. Accordingly, after performing the wet etching process WEP2, as shown in FIG. 2D, the work function metal layers 214a, 214b, 214c over the semiconductor nanosheets 230 and the work function metal layer 214a around the semiconductor nanosheets 230 and between the semiconductor nanosheet 230 and the substrate 202 may be removed completely. Then, as shown in FIG. 2D, an opening 254 is formed, and the opening 254 exposes the gate dielectric layer 212 immediately adjacent to the work function metal layer 214a and wrapping around the semiconductor nanosheets 230.

In some embodiments, the wet etching process WEP2 uses an acidic etching solution containing an acid and an oxidant. The acid may include hydrogen chloride (HCl), $H_2SO_4$, $H_3PO_4$, the like, a combination thereof or other suitable acid, and a concentration of the acid may be in a range of 0.1 wt % to 50 wt %. The oxidant may include peroxide ($H_2O_2$), ozone, the like, a combination thereof or other suitable oxidant, and a concentration of the oxidant may be in a range of 0.1 ppm to $10^7$ ppm. The oxidant in the acidic etching solution may be the same as or different from the oxidant using in the alkaline etching solution. The acidic etching solution further includes water ($H_2O$). In an embodiment, the acidic etching solution contains HCl, $H_2O_2$ and $H_2O$. For example, the acidic etching solution is consisting of HCl, $H_2O_2$ and $H_2O$.

In some embodiments, as shown in FIG. 2D, the cleaning process CP is performed to physically remove the remained etching solution such as the remained alkaline etching solution and the remained acidic etching solution and ions generated after the wet etching process WEP2. In some embodiments, the cleaning process CP is performed by using a water nanospray such as DI water nanospray. For example, the water nanospray is provided above the semiconductor nanosheets 230. The water nanospray cleans surfaces of the gate dielectric layer 212 exposed by the opening 254 after removing the work function metal layers 214a, 214b, 214c. In some embodiments, exposed surfaces (e.g., top surfaces, bottom surfaces and sidewall surfaces of the gate dielectric layer 212 are cleaned. In some embodiments, since the semiconductor nanosheets 230 and the spacers 220 are covered by the gate dielectric layer 212, and thus the semiconductor nanosheets 230 and the spacers 220 may be not exposed due to the removal of the work function metal layers 214a, 214b, 214c. However, the disclosure is not limited thereto. In some alternative embodiments, the semiconductor nanosheets 230 and the spacers 220 may be exposed due to the removal of the work function metal layers 214a, 214b, 214c. In such embodiments, the cleaning process CP may also clean the exposed surfaces of the semiconductor nanosheets 230 and the spacers 220.

In some embodiments, after performing the wet etching process WEP1, the cycle of the wet etching process WEP2 and the cleaning process CP may be repeated several times according to the requirements. Thus, the work function metal layers 214a, 214b and 214c or any other metal materials may be removed entirely and there is substantially no work function metal layers 214a, 214b and 214c and/or residues remained. Particularly, the work function metal layer 214a shielded by the semiconductor nanosheets 230 may be removed entirely and there is substantially no work function metal layers 214a and/or residues thereof remained between the semiconductor nanosheets 230 or below the semiconductor nanosheets 230. In some embodiments, the wet etching process WEP1 and the wet etching process WEP2 have high selectivity between the metal materials such as the work function metal layer 214a and the silicon-containing layers such as the semiconductor nanosheets 230, the gate dielectric layer 212 and the spacers 220 which are adjacent to the work function metal layer 214a. Therefore, the semiconductor nanosheets 230, the gate dielectric layer 212 and the spacers 220 may be substantially intact without being removed or corroded by the wet etching process WEP1 and the wet etching process WEP2. For example, as shown in FIG. 3B, after performing the wet etching process WEP1, the wet etching process WEP2 and the cleaning process CP, a profile such as the turning point TP (or sharp corner) formed between the top surface 222c and the inner sidewall 222a of the spacer 220 remains without being rounded.

Figure 2E:
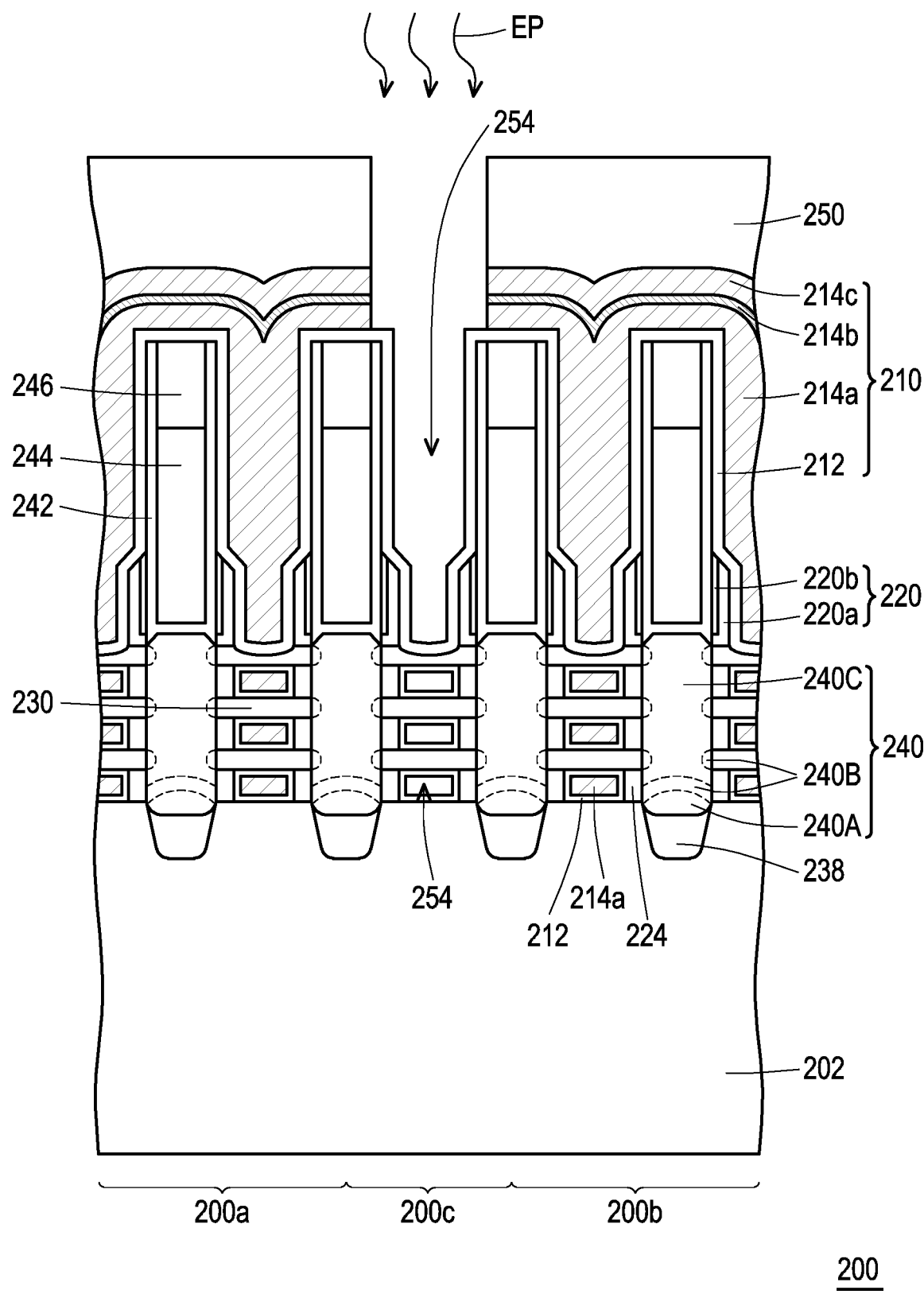
Figure 2F:
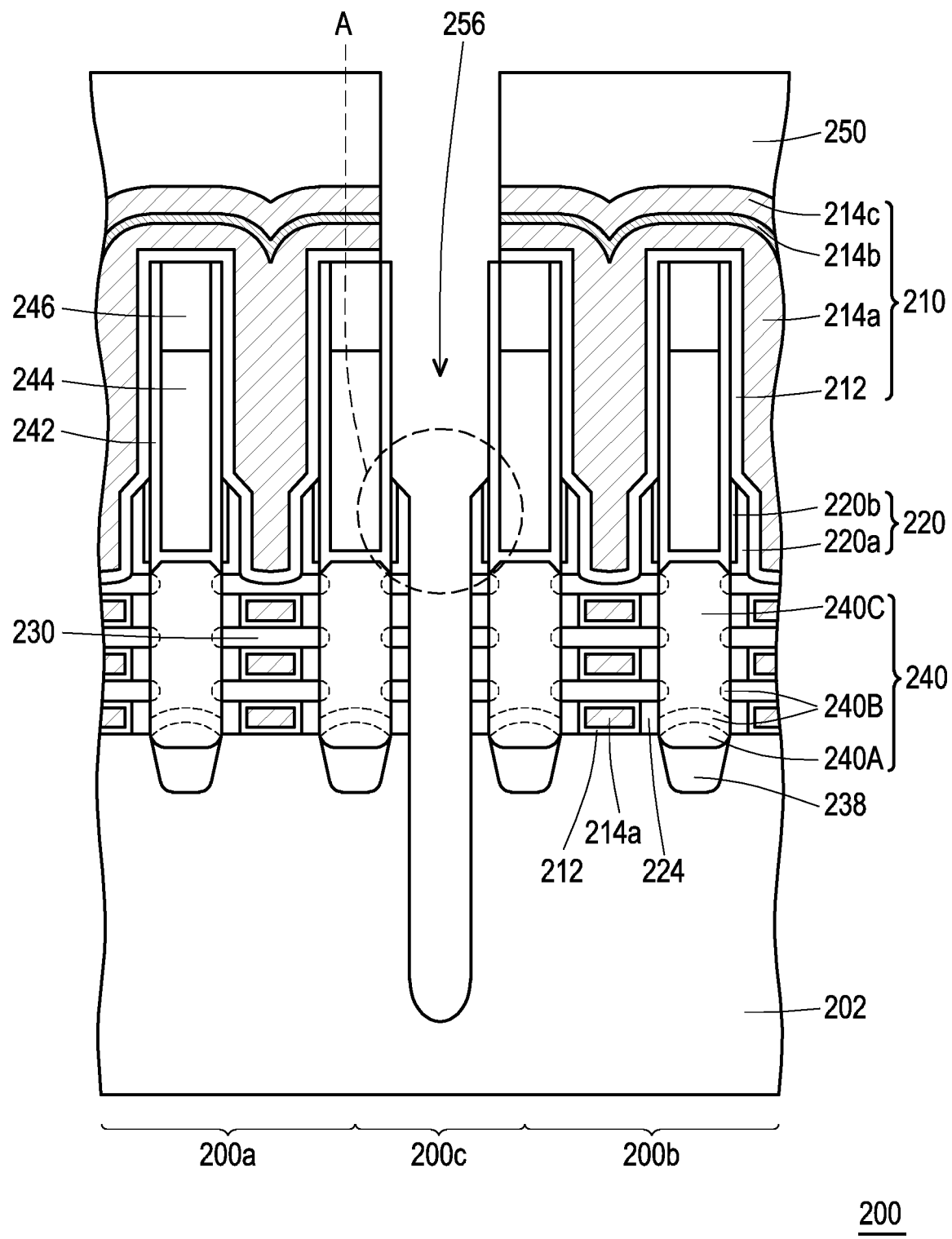

Referring to FIG. 2E and FIG. 2F, an etching process EP is performed to remove the semiconductor nanosheets 230, to form an opening 256 of FIG. 2F. In some embodiments, the etching process EP is performed after all cycles are finished. In some embodiments, the etching process EP removes the semiconductor nanosheets 230, the gate dielectric layer 212 and a portion of the substrate 202. The etching process EP may have high selectivity between the semiconductor nanosheets 230, the gate dielectric layer 212 and the substrate 202 and the spacers 220. Thus, after performing the etching process EP, as shown in FIG. 2F and FIG. 3B, the semiconductor nanosheets 230, the gate dielectric layer 212 and a portion of the substrate 202 may be removed entirely while the spacers 220 and the CESL 242 remain substantially intact. For example, as shown in FIG. 3B, after performing the etching process EP, a profile such as the turning point TP (or sharp corner) formed between the top surface 222c and the inner sidewall 222a of the spacer 220 remains without being rounded. The etching process EP may be a dry etching process. The etching process EP may use HBr or any other suitable etchant.

Then, as shown in FIG. 2F, the opening 256 is formed, and the opening 256 exposes the spacers 220, the CESL 242 and the remained substrate 202, for example. In some embodiments, after performing the wet etching process WEP1, the cycle(s) of the wet etching process WEP2 and the cleaning process CP, and the etching process EP, the electrical connection between the first region 200a and the second region 200b is cut.

Figure 2G:
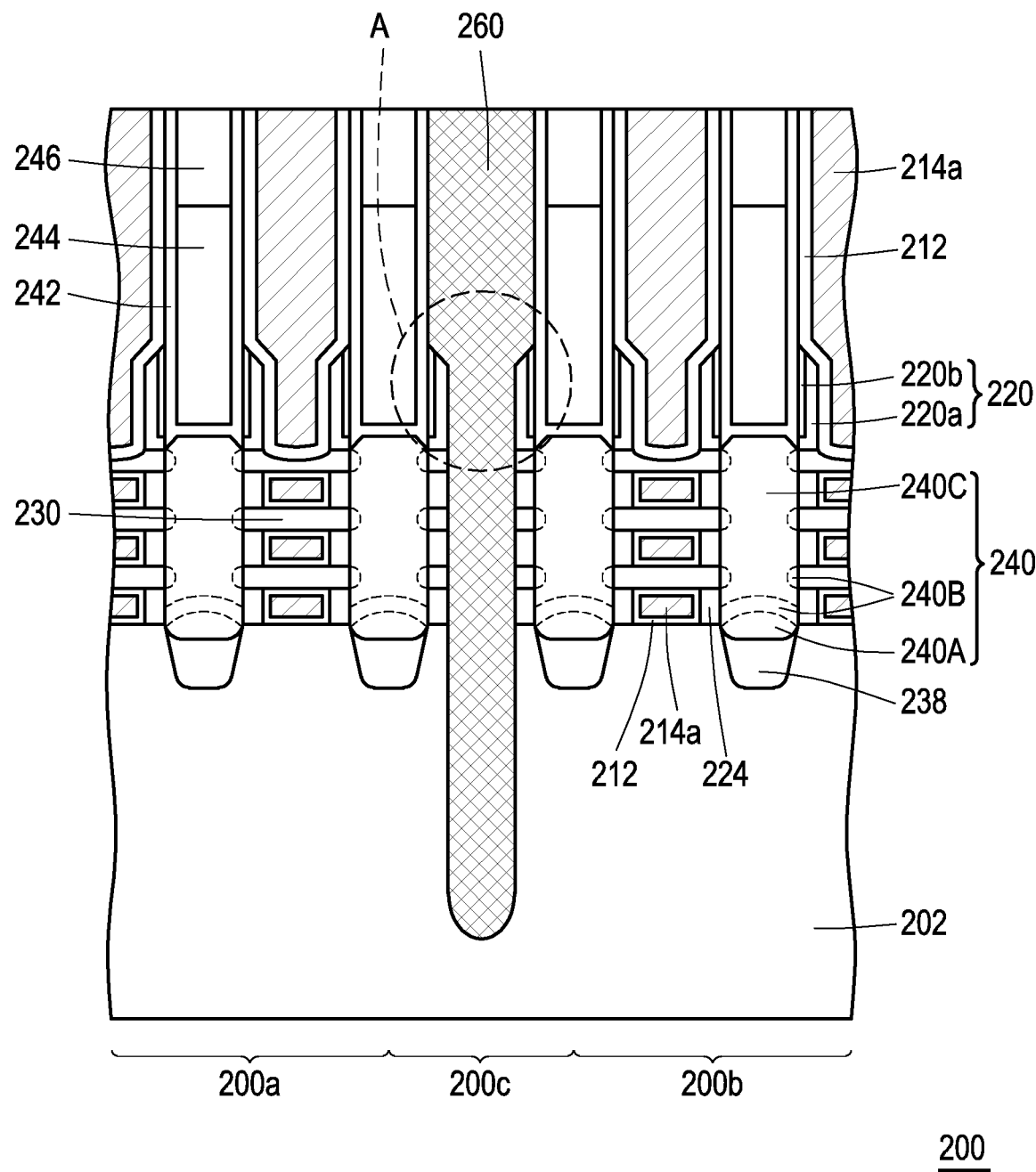

Referring to FIG. 2G, a dielectric pattern 260 is formed in the opening 256, to electrically isolate the first region 200a and the second region 200b. In some embodiments, a dielectric material is formed over the patterned mask layer 250 to fill up the opening 256 and cover the patterned mask layer 250. Thereafter, the dielectric material is partially removed, to form the dielectric pattern 260. In some embodiments, the dielectric material is partially removed through a mechanical grinding process, a CMP process, or the like. In some embodiments, during the removal of the dielectric material, the patterned mask layer 250, the work function metal layer 214a, 214b, 214c and the gate dielectric layer 212 in the first and second regions 200a and 200b are partially removed until the contacts 246 are exposed. In some embodiments, the dielectric pattern 260 is disposed between the first region 200a and the second region 200b and extends into the substrate 202. For example, the dielectric pattern 260 is disposed between the gate structure 210 in the first region 200a and the gate structure 210 in the second region 200b, and similarly, the dielectric pattern 260 is disposed between the semiconductor nanosheet 230 in the first region 200a and the semiconductor nanosheet 230 in the second region 200b.

In some embodiments, a top surface of the dielectric pattern 260 is substantially coplanar with top surfaces of the gate structures 210, the CESLs 242 and the contacts 246 in the first region 200a and the second region 200b. A bottom surface of the dielectric pattern 260 may be lower than bottom surfaces of the gate structures 210 and the semiconductor nanosheets 230 in the first region 200a and the second region 200b. For example, the bottom surface of the dielectric pattern 260 is lower than bottom surfaces of the doped regions 238 in the substrate 202. In some embodiments, as shown in FIG. 3C, the spacers 220 are disposed on opposite sidewalls of the dielectric pattern 260. The inner sidewall 222a is in direct contact with the dielectric pattern 260, and the turning point TP (or a sharp corner) is formed between the top surface 222c and the inner sidewall 222a of the spacer 220, for example.

In some embodiments, by using the wet etching process WEP1 and the cycle of the wet etching process WEP2 and the cleaning process CP, the metal materials in the separation region 200c such as the work function metal layers 214a, 214b, 214c may be removed completely. In detail, the wet etching process WEP2 may globally remove the work function metal layers 214a, 214b, 214c without direction. Thus, the etching path would not be obstructed and/or shielded by heteromaterials such as the semiconductor nanosheets 230, and the work function metal layer 214a around the semiconductor nanosheets 230 and below the semiconductor nanosheets 230 may be removed completely. Furthermore, the cleaning process CP may remove the remained etching solutions and residues, so as to improve the efficiency of the wet etching process WEP2 of the next cycle. In addition, the wet etching process WEP2 has high selectivity between the work function metal layer 214a and the semiconductor nanosheets 230 and other layers (such as the gate dielectric layer 212 and the spacer 220) immediately adjacent to the work function metal layer 214a, and thus the semiconductor nanosheets 230 and other layers may remain intact. For example, the bending, collapse and/or corrosion of the semiconductor nanosheets 230 and other layers are prevented. Accordingly, after removal of the work function metal layer 214a (or removal of the work function metal layer 214a and the semiconductor nanosheets 230) in the separation region 200c, the resulting structure may be intact and have robust construction. For example, the spacers 220 are devoid of being broken.

In some embodiments, the electrical connection between the first region 200a and the second region 200b is cut by the dielectric pattern 260 in the separation region 200c. For example, the gate structures 210 (also referred to as first gate structures) in the first region 200a and the gate structures 210 (also referred to as second gate structures) in the second region 200b are electrically isolated by the dielectric pattern 260. Thus, the first region 200a and the second region 200b may be respectively an individual semiconductor device. In addition, since the metal materials in the separation region may be removed entirely and there is substantially no residues in the separation region, Vt shift and the performance of the formed semiconductor device may be improved.

Figure 4:
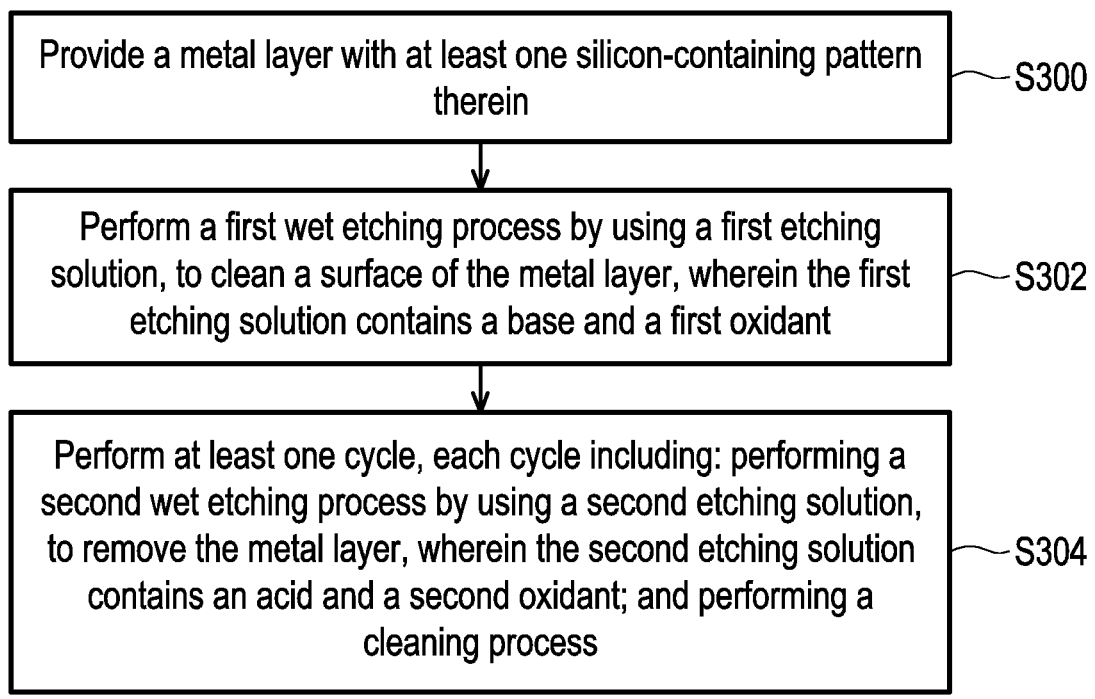
FIG. 4 illustrates a method of forming a semiconductor device in accordance with some embodiments of the present disclosure.

FIG. 4 illustrates a method of forming a semiconductor device in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a metal layer with at least one silicon-containing pattern therein is provided. FIG. 1A and FIG. 2A illustrate views corresponding to some embodiments of act S300.

At act S302, a first wet etching process is performed by using a first etching solution, to clean a surface of the metal layer, wherein the first etching solution contains a base and a first oxidant. FIG. 1B and FIG. 2B illustrate views corresponding to some embodiments of act S302.

At act S304, at least one cycle is performed. Each cycle includes a second wet etching process and a cleaning process. The second wet etching process is performed by using a second etching solution, to remove the metal layer, wherein the second etching solution contains an acid and a second oxidant. The cleaning process is performed. FIG. 1C, FIG. 1D, FIG. 2C and FIG. 2D illustrate views corresponding to some embodiments of act S304.

Figure 5:
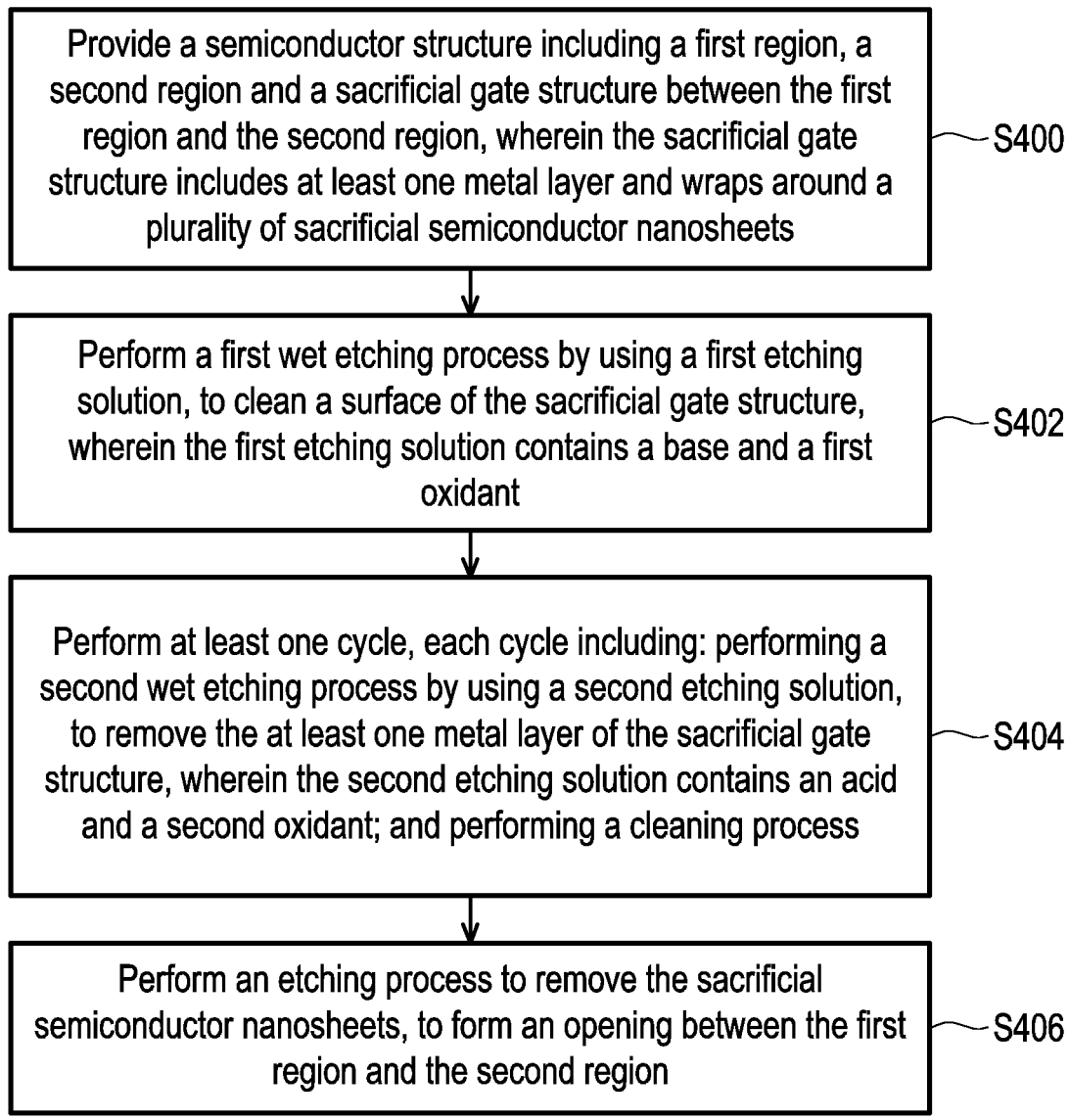
FIG. 5 illustrates a method of forming a semiconductor device in accordance with some embodiments of the present disclosure.

FIG. 5 illustrates a method of forming a semiconductor device in accordance with some embodiments of the present disclosure. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S400, a semiconductor structure including a first region, a second region and a sacrificial gate structure between the first region and the second region is provided, wherein the sacrificial gate structure includes at least one metal layer and wraps around a plurality of sacrificial semiconductor nanosheets. FIG. 2A illustrates a view corresponding to some embodiments of act S400.

At act S402, a first wet etching process is performed by using a first etching solution, to clean a surface of the sacrificial gate structure, wherein the first etching solution contains a base and a first oxidant. FIG. 2B illustrates a view corresponding to some embodiments of act S402.

At act S404, at least one cycle is performed. Each cycle includes a second wet etching process and a cleaning process. The second wet etching process is performed by using a second etching solution, to remove the at least one metal layer of the sacrificial gate structure, wherein the second etching solution contains an acid and a second oxidant. A cleaning process is performed. FIG. 2C and FIG. 2D illustrates views corresponding to some embodiments of act S404.

At act S406, an etching process is performed to remove the sacrificial semiconductor nanosheets, to form an opening between the first region and the second region. FIG. 2E illustrates a view corresponding to some embodiments of act S406.

In accordance with some embodiments of the disclosure, a method of forming a semiconductor device includes the following steps. A metal layer with at least one silicon-containing pattern therein is provided. A first wet etching process is performed by using a first etching solution, to clean a surface of the metal layer, wherein the first etching solution contains a base and a first oxidant. At least one cycle is performed. Each cycle includes a second wet etching process and a cleaning process. The second wet etching process is performed by using a second etching solution, to remove the metal layer, wherein the second etching solution contains an acid and a second oxidant. The cleaning process is performed.

In accordance with some embodiments of the disclosure, a method of forming a semiconductor device includes the following steps. A semiconductor structure including a first region, a second region and a sacrificial gate structure between the first region and the second region is provided, wherein the sacrificial gate structure includes at least one metal layer and wraps around a plurality of sacrificial semiconductor nanosheets. A first wet etching process is performed by using a first etching solution, to clean a surface of the sacrificial gate structure, wherein the first etching solution contains a base and a first oxidant. At least one cycle is performed. Each cycle includes a second wet etching process and a cleaning process. The second wet etching process is performed by using a second etching solution, to remove the at least one metal layer of the sacrificial gate structure, wherein the second etching solution contains an acid and a second oxidant. A cleaning process is performed. An etching process is performed to remove the sacrificial semiconductor nanosheets, to form an opening between the first region and the second region.

In accordance with some embodiments of the disclosure, a semiconductor device includes a first region, a second region and a separation region between the first region and the second region. The first region includes a plurality of first semiconductor nanosheets and a first gate structure wrapping around each of the first semiconductor nanosheets. The second region includes a plurality of second semiconductor nanosheets and a second gate structure wrapping around each of the second semiconductor nanosheets. The separation region includes a dielectric pattern and a spacer. The dielectric pattern electrically isolates the first gate structure and the second gate structure. The spacer is disposed on a sidewall of the dielectric pattern, wherein the spacer includes a sidewall in direct contact with the dielectric pattern and a top surface, and a turning point is formed between the top surface and the sidewall of the spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   providing a metal layer with at least one silicon-containing pattern therein;
   performing a first wet etching process by using a first etching solution, to clean a surface of the metal layer, wherein the first etching solution contains a base and a first oxidant;
   performing at least one cycle, each cycle comprising:
      performing a second wet etching process by using a second etching solution, to remove the metal layer, wherein the second etching solution contains an acid and a second oxidant; and
      performing a cleaning process.

2. The method of claim 1, wherein the cleaning process is performed by using a water nanospray.

3. The method of claim 1, wherein the at least one silicon-containing pattern comprises a plurality of silicon-containing patterns stacked on one another, and the metal layer wraps around each of the plurality of silicon-containing patterns.

4. The method of claim 1, wherein the at least one silicon-containing pattern is a nanosheet.

5. The method of claim 1, wherein the first wet etching process is performed to remove at least one of a native oxide layer and surface contaminants on a top surface of the metal layer.

6. The method of claim 1, further comprising performing a dry etching process to remove the at least one silicon-containing pattern after performing the at least one cycle.

7. A method of forming a semiconductor device, comprising:
providing a semiconductor structure comprising a first region, a second region and a sacrificial gate structure between the first region and the second region, wherein the sacrificial gate structure comprises at least one metal layer and wraps around a plurality of sacrificial semiconductor nanosheets;
performing a first wet etching process by using a first etching solution, to clean a surface of the sacrificial gate structure, wherein the first etching solution contains a base and a first oxidant;
performing at least one cycle, each cycle comprising:
performing a second wet etching process by using a second etching solution, to remove the at least one metal layer of the sacrificial gate structure, wherein the second etching solution contains an acid and a second oxidant; and
performing a cleaning process;
performing an etching process to remove the sacrificial semiconductor nanosheets, to form an opening between the first region and the second region.

8. The method of claim 7, wherein the cleaning process is performed by using a water nanospray.

9. The method of claim 7, further comprising forming a patterned mask layer to cover the first region and the second region and expose the sacrificial gate structure, wherein the first wet etching process, the at least one cycle and the etching process are performed by using the patterned mask layer as a mask.

10. The method of claim 7, further comprising forming a spacer on the sacrificial gate structure, the spacer comprising an inner sidewall being in direct contact with the sacrificial gate structure, a top surface and a turning point formed between the inner sidewall and the top surface, wherein the turning point exists after performing the first wet etching process and the at least one cycle.

11. The method of claim 7, wherein the sacrificial gate structure further comprises a gate dielectric layer on surfaces of the plurality of sacrificial semiconductor nanosheets, and the etching process further removes the gate dielectric layer.

12. The method of claim 7, wherein the etching process further removes a portion of a substrate below the plurality of sacrificial semiconductor nanosheets.

13. The method of claim 7, wherein the at least one metal layer comprises a work function metal layer, and the sacrificial semiconductor nanosheets includes silicon.

14. The method of claim 7, further comprising forming a dielectric pattern in the opening.

15. A method of forming a semiconductor device, comprising:
forming a gate structure over a semiconductor substrate, to wrap a plurality of first semiconductor nanosheets in a first region, a plurality of second semiconductor nanosheets in a second region and a plurality of sacrificial semiconductor nanosheets in a third region between the first region and second region, the gate structure comprises a metal layer and a gate dielectric layer;
forming a mask to cover the first region and the second region and expose the third region;
performing a first wet etching process by using a first etching solution, to clean a surface of the gate structure in the third region exposed by the mask, wherein the first etching solution contains a base and a first oxidant;
performing a second wet etching process by using a second etching solution, to remove the metal layer in the third region exposed by the mask and form an opening, wherein the second etching solution contains an acid and a second oxidant;
performing an etching process to remove the sacrificial semiconductor nanosheets and the gate dielectric layer in the third region exposed by the opening; and
forming an isolation structure in the opening, wherein the gate structure remained in the first region and the gate structure remained in the second region are separated by the isolation structure therebetween.

16. The method of claim 15, further comprising forming a spacer before performing the first wet etching process and the second wet etching process, wherein during the first wet etching process and the second wet etching process, the spacer is covered by the gate dielectric layer.

17. The method of claim 16, wherein the spacer surrounds the gate structure in the third region, and the spacer has an included top surface facing the isolation structure.

18. The method of claim 15, further comprising a planarization process on the gate structure remained in the first region, the gate structure remained and the isolation structure in the third region.

19. The method of claim 15, further comprising:
forming an epitaxial feature over the semiconductor substrate;
forming a dielectric layer on the epitaxial feature and a contact on the dielectric layer, wherein the gate structure covers the dielectric layer and the contact; and
forming a spacer, wherein the spacer is disposed between the dielectric layer and the isolation structure.

20. The method of claim 19, wherein the epitaxial feature is electrically connected to a doped region in the semiconductor substrate, and the isolation structure is disposed in a depth of the semiconductor substrate larger than the doped region.

* * * * *